United States Patent
Saeki

(10) Patent No.: US 8,329,561 B2
(45) Date of Patent: Dec. 11, 2012

(54) METHOD OF PRODUCING SEMICONDUCTOR DEVICE

(75) Inventor: Yoshihiro Saeki, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 195 days.

(21) Appl. No.: 12/725,719

(22) Filed: Mar. 17, 2010

(65) Prior Publication Data

US 2010/0248450 A1 Sep. 30, 2010

(30) Foreign Application Priority Data

Mar. 26, 2009 (JP) ................................ 2009-077566

(51) Int. Cl.
*H01L 21/00* (2006.01)
(52) U.S. Cl. ................. 438/460; 438/462; 257/E21.122
(58) Field of Classification Search ............ 438/33, 438/68, 113, 114, 458, 460, 462; 257/E21.122
See application file for complete search history.

(56) References Cited

U.S. PATENT DOCUMENTS

| | | | |
|---|---|---|---|
| 6,794,273 B2 * | 9/2004 | Saito et al. ................. | 438/462 |
| 7,435,621 B2 * | 10/2008 | Yang ............................ | 438/110 |
| 2010/0015782 A1 * | 1/2010 | Yu et al. ..................... | 438/463 |

FOREIGN PATENT DOCUMENTS

JP 2006-231413 9/2006

* cited by examiner

*Primary Examiner* — Brook Kebede
(74) *Attorney, Agent, or Firm* — Kubotera & Associates, LLC

(57) ABSTRACT

A method of producing a semiconductor device includes: a dicing step of dicing a wafer member using a dicing blade to form a cut portion in the wafer member, in which the wafer member is formed of a wafer portion, a glass substrate, and an adhesive layer for bonding the wafer portion and the glass substrate in a thickness direction of the wafer member so that the cut portion penetrates the wafer portion and the adhesive layer and reaches a part of the glass substrate; and an individual piece dividing step of dividing the wafer member into a plurality of semiconductor devices with the cut portion as a fracture initiation portion.

10 Claims, 5 Drawing Sheets

METHOD OF PRODUCING SEMICONDUCTOR DEVICE

BACKGROUND OF THE INVENTION AND RELATED ART STATEMENT

The present invention relates to a method of producing a semiconductor device.

Patent Reference has disclosed a conventional method of producing a semiconductor device. In Patent Reference, an object to be processed is formed of a silicon substrate and a glass substrate. Modified regions are formed near a surface of the semiconductor substrate and a surface of the glass substrate using a laser beam. Afterward, a knife edge is pressed against a backside surface of the object to be processed, thereby cutting and dividing the object to be processed.

Patent Reference: Japanese Patent Publication No. 2006-231413

In the conventional method of producing the semiconductor device, it is necessary to improve production efficiency.

In view of the problems described above, an object of the present invention is to provide a method of producing a semiconductor device capable of solving the problems of the conventional method of producing the semiconductor device. In the present invention, it is possible to improve production efficiency.

Further objects and advantages of the invention will be apparent from the following description of the invention.

SUMMARY OF THE INVENTION

In order to attain the objects described above, according to a first aspect of the present invention, a method of producing a semiconductor device includes: a dicing step of dicing a wafer member using a dicing blade to form a cut portion in the wafer member, in which the wafer member is formed of a wafer portion, a glass substrate, and an adhesive layer for bonding the wafer portion and the glass substrate in a thickness direction of the wafer member so that the cut portion penetrates the wafer portion and the adhesive layer and reaches a part of the glass substrate; and an individual piece dividing step of dividing the wafer member into a plurality of semiconductor devices with the cut portion as a fracture initiation portion.

In the first aspect of the present invention, the wafer member is diced using the dicing blade to form the cut portion in the wafer member, so that the cut portion penetrates the wafer portion and the adhesive layer and reaches the part of the glass substrate. Afterward, a stress is applied to the wafer member, so that the wafer member is divided into the semiconductor devices along the cut portion.

More specifically, in the method of producing the semiconductor device, the glass substrate is not completely cut with the dicing blade in the thickness direction. Instead, as described above, the wafer member is diced using the dicing blade to form the cut portion reaching the part of the glass substrate.

Accordingly, as compared with a case that the wafer member is diced using the dicing blade to completely cut the glass substrate, it is possible to reduce resistance applied to the dicing blade from the glass substrate. As a result, even when the dicing blade is subject to resistance from the glass substrate greater than that from the wafer portion, it is not necessary to decrease a rotational speed and a moving speed of the dicing blade according to the glass substrate, thereby making it possible to increase the rotational speed and the moving speed of the dicing blade according to the wafer portion.

As a result, as compared with the case that the wafer member is diced using the dicing blade to completely cut the wafer portion, the adhesive layer, and the glass substrate, it is possible to reduce a period of time in the dicing step, thereby improving production efficiency of the semiconductor device.

According to a second aspect of the present invention, a method of producing a semiconductor device includes: a fracture initiation portion forming step of forming a fracture initiation portion in a surface layer of a glass substrate of a wafer member, in which the wafer member is formed of a wafer portion, the glass substrate, and an adhesive layer for bonding the wafer portion and the glass substrate in a thickness direction of the wafer member so that the surface layer of the glass substrate is situated on a side opposite to the adhesive layer; a dicing step of dicing the wafer member along the fracture initiation portion using a dicing blade to form a cut portion in the wafer member so that the cut portion penetrates the wafer portion and the adhesive layer and reaches a part of the glass substrate toward the adhesive layer beyond the fracture initiation portion; and an individual piece dividing step of dividing the wafer member into a plurality of semiconductor devices along the fracture initiation portion and the cut portion.

In the second aspect of the present invention, the fracture initiation portion is formed in the surface layer of the glass substrate on the side opposite to the adhesive layer. The fracture initiation portion may be formed of one of a notch portion, a scratch portion, and a modified region using a laser beam. Further, the wafer member is diced using the dicing blade to form the cut portion in the wafer member, so that the cut portion is overlapped with the fracture initiation portion in a plan view of the wafer member. Further, the cut portion penetrates the wafer portion and the adhesive layer and reaches the part of the glass substrate toward the adhesive layer beyond the fracture initiation portion. Afterward, a stress is applied to the wafer member, so that the wafer member is divided into the semiconductor devices along the fracture initiation portion and the cut portion.

More specifically, in the method of producing the semiconductor device, the glass substrate is not completely cut with the dicing blade in the thickness direction. Instead, as described above, the wafer member is diced using the dicing blade to form the cut portion reaching the part of the glass substrate.

Accordingly, as compared with a case that the wafer member is diced using the dicing blade to completely cut the glass substrate, it is possible to reduce resistance applied to the dicing blade from the glass substrate. As a result, even when the dicing blade is subject to resistance from the glass substrate greater than that from the wafer portion, it is not necessary to decrease a rotational speed and a moving speed of the dicing blade according to the glass substrate, thereby making it possible to increase the rotational speed and the moving speed of the dicing blade according to the wafer portion.

As a result, as compared with the case that the wafer member is diced using the dicing blade to completely cut the wafer portion, the adhesive layer, and the glass substrate, it is possible to reduce a period of time in the dicing step, thereby improving production efficiency of the semiconductor device.

Further, the fracture initiation portion and the cut portion are formed in both side surfaces of the glass substrate.

Accordingly, as compared with a case that only the cut portion is formed in the glass substrate on a side of the adhesive layer, it is possible to reduce a variance in an outer dimension of each of the semiconductor devices when the wafer member is divided into the semiconductor devices.

According to a third aspect of the present invention, a method of producing a semiconductor device includes: a dicing step of dicing a wafer member using a dicing blade to form a cut portion in the wafer member, in which the wafer member is formed of a wafer portion, a glass substrate, and an adhesive layer for bonding the wafer portion and the glass substrate in a thickness direction of the wafer member so that the cut portion penetrates the wafer portion and the adhesive layer and reaches a part of the glass substrate; a fracture initiation portion forming step of forming a fracture initiation portion in a surface layer of the glass substrate on a side opposite to the adhesive layer so that the fracture initiation portion is overlapped with the cut portion in a plan view of the wafer member; and an individual piece dividing step of dividing the wafer member into a plurality of semiconductor devices along the cut portion and the fracture initiation portion.

In the third aspect of the present invention, the wafer member is diced using the dicing blade to form the cut portion in the wafer member, so that the cut portion penetrates the wafer portion and the adhesive layer and reaches the part of the glass substrate. Afterward, the fracture initiation portion is formed in the surface layer of the glass substrate on the side opposite to the adhesive layer. The fracture initiation portion may be formed of one of a notch portion, a scratch portion, and a modified region using a laser beam. Afterward, a stress is applied to the wafer member, so that the wafer member is divided into the semiconductor devices along the fracture initiation portion and the cut portion.

More specifically, in the method of producing the semiconductor device, the glass substrate is not completely cut with the dicing blade in the thickness direction. Instead, as described above, the wafer member is diced using the dicing blade to form the cut portion reaching the part of the glass substrate.

Accordingly, as compared with a case that the wafer member is diced using the dicing blade to completely cut the glass substrate, it is possible to reduce resistance applied to the dicing blade from the glass substrate. As a result, even when the dicing blade is subject to resistance from the glass substrate greater than that from the wafer portion, it is not necessary to decrease a rotational speed and a moving speed of the dicing blade according to the glass substrate, thereby making it possible to increase the rotational speed and the moving speed of the dicing blade according to the wafer portion.

As a result, as compared with the case that the wafer member is diced using the dicing blade to completely cut the wafer portion, the adhesive layer, and the glass substrate, it is possible to reduce a period of time in the dicing step, thereby improving production efficiency of the semiconductor device.

Further, the fracture initiation portion and the cut portion are formed in both side surfaces of the glass substrate. Accordingly, as compared with a case that only the cut portion is formed in the glass substrate on a side of the adhesive layer, it is possible to reduce a variance in an outer dimension of each of the semiconductor devices when the wafer member is divided into the semiconductor devices.

As described above, according to the present invention, it is possible to improve the production efficiency when the semiconductor device is produced.

DETAILED DESCRIPTION OF PREFERRED EMBODIMENTS

Hereunder, preferred embodiments of the present invention will be explained with reference to the accompanying drawings.

First Embodiment

Figure 1:
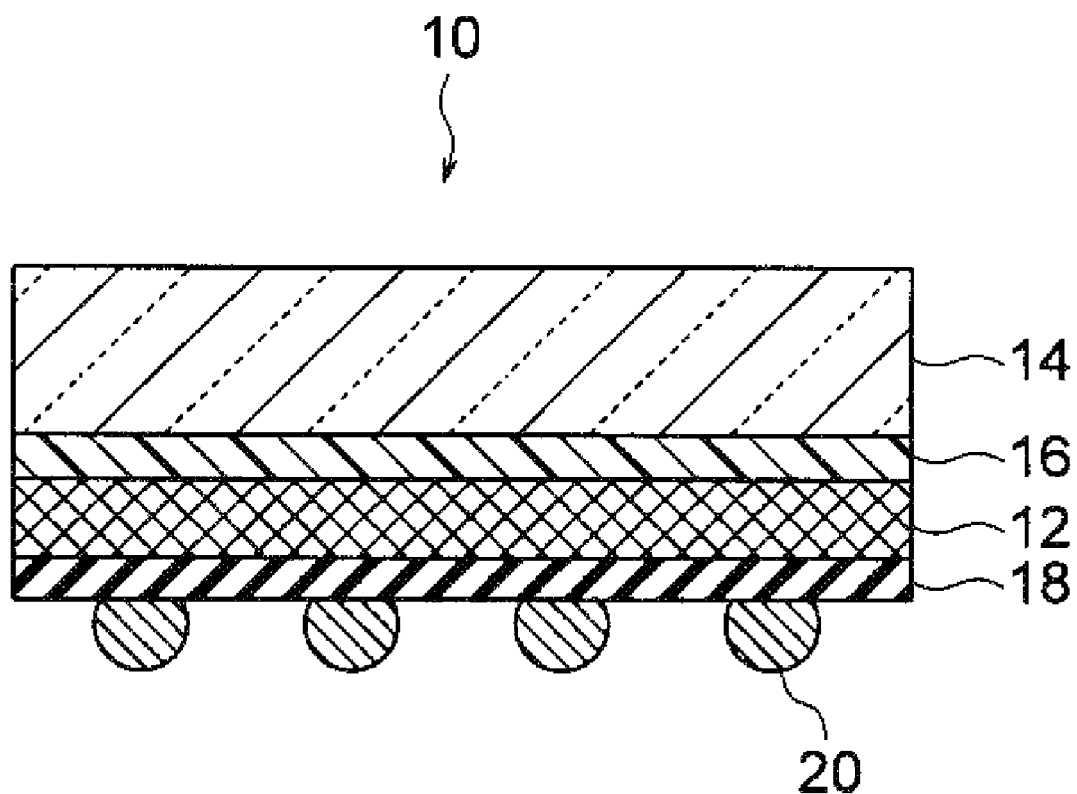
FIG. 1 is a schematic sectional view showing a semiconductor device according to a first embodiment of the present invention.

A first embodiment of the present invention will be explained with reference to FIG. 1. FIG. 1 is a schematic sectional view showing a semiconductor device 10 according to the first embodiment of the present invention.

As shown in FIG. 1, the semiconductor device 10 may be an image sensor CSP (Chip Size Package). The semiconductor device 10 includes a wafer 12 (a sensor chip), a glass substrate 14, an adhesive layer 16, an insulation film 18, and outer connection terminals 20.

In the embodiment, the wafer 12 is attached to the glass substrate 14 in a thickness direction thereof with the adhesive layer 16. The wafer 12 is formed of, for example, silicon, and the glass substrate 14 is formed of, for example, quartz. Further, the glass substrate 14 has a hardness greater than that of the wafer 12, so that the glass substrate 14 exhibits resistance relative to a dicing blade (described later) greater than that of the wafer 12.

In the embodiment, the insulation film 18 is laminated on the wafer 12 from a side thereof opposite to the adhesive layer 16. The outer connection terminals 20 are disposed on the insulation film 18 on a side thereof opposite to the wafer 12.

Figure 2:
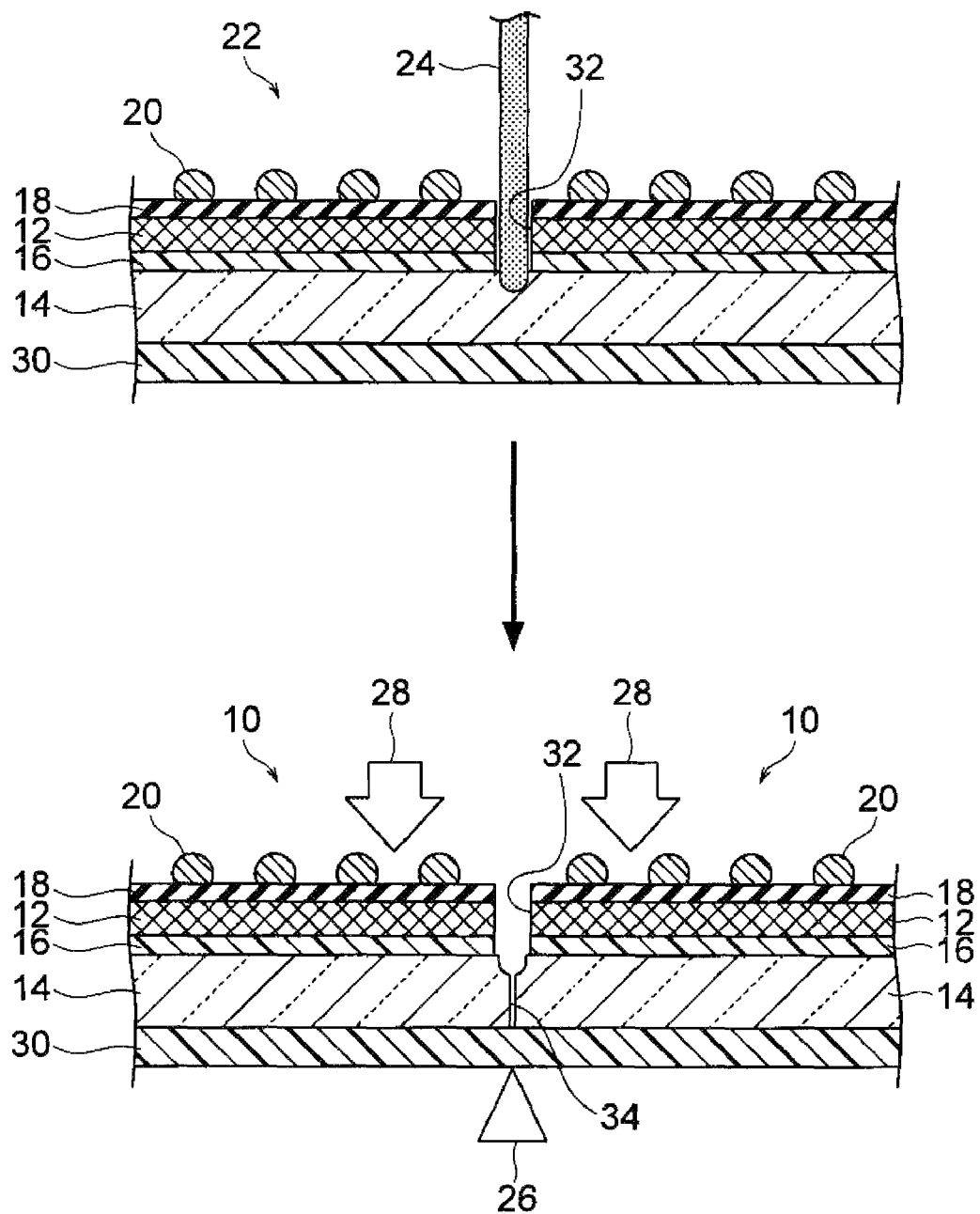
FIG. 2 is a schematic sectional view showing the semiconductor device in a manufacturing process thereof according to the first embodiment of the present invention.

A method of producing the semiconductor device 10 will be explained next. FIG. 2 is a schematic sectional view showing the semiconductor device 10 in a manufacturing process thereof according to the first embodiment of the present invention.

As shown in an upper portion of FIG. 2, before a wafer member 22 is divided into a single piece, the wafer member 22 is attached to a dicing tape 30 such that the glass substrate 14 faces downwardly. In this state, a cut portion 32 is formed with a dicing blade 24, so that the cut portion 32 penetrates the insulation film 18, the wafer 12, and the adhesive layer 16 and reaches a part of the glass substrate 14 in a thickness direction of the semiconductor device 10 (a dicing step).

In the next step, as shown in a lower portion of FIG. 2, a supporting stage 26 is placed under the dicing tape 30, and a mechanical stress 28 is applied to the wafer member 22 on both sides of the supporting stage 26 from a side of the outer connection terminals 20. As a result, the cut portion 32 becomes an initiation portion of a crack 34 in the glass substrate 14. When the crack 34 propagates through the glass substrate 14, the wafer member 22 is divided into a plurality of semiconductor devices 10 (an individual piece dividing step).

Figure 5:
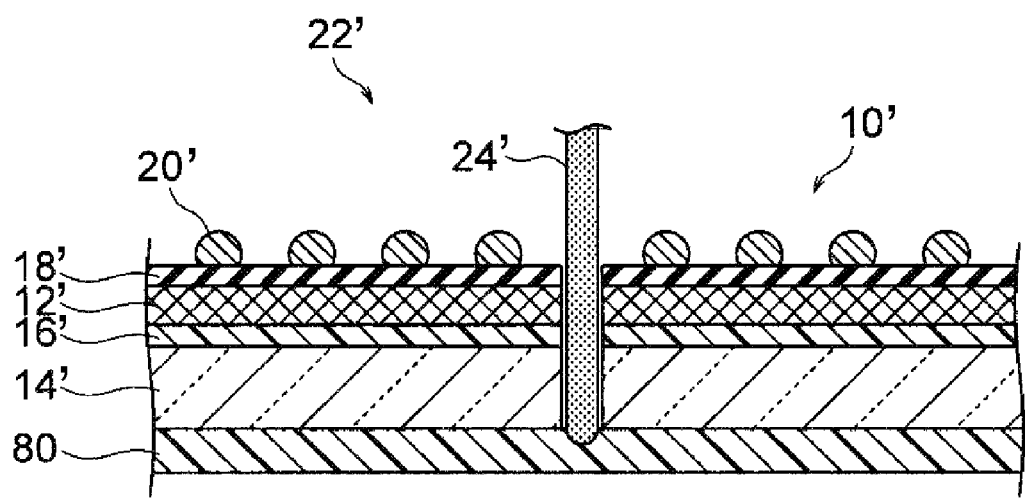
FIG. 5 is a schematic sectional view showing a semiconductor device in a conventional manufacturing process thereof.

A conventional method of producing a semiconductor device 10' will be explained as a comparative example with reference to FIG. 5, as compared to the method of producing the semiconductor device 10 in the first embodiment of the present invention. FIG. 5 is a schematic sectional view showing the semiconductor device 10' in a conventional manufacturing process thereof.

In the conventional manufacturing process, before a wafer member 22' is divided into a single piece, the wafer member 22' is attached to a dicing tape 80 such that a glass substrate 14' faces downwardly. In this state, an insulation film 18', a wafer 12', an adhesive layer 16' and the glass substrate 14' are cut with a dicing blade 24', so that the wafer member 22' is divided into a plurality of semiconductor devices 10'.

As described above, the glass substrate 14' exhibits resistance relative to the dicing blade 24' greater than that of the wafer 12'. Accordingly, when the dicing blade 24' cuts the wafer member 22', it is necessary to decrease a rotational speed and a moving speed of the dicing blade 24' according to the glass substrate 14'. As a result, it is difficult to reduce a period of time in the dicing step, thereby deteriorating production efficiency of the semiconductor device 10'.

On the other hand, in the embodiment of the present invention, as shown in FIG. 2, the cut portion 32 is formed with the dicing blade 24, so that the cut portion 32 penetrates the insulation film 18, the wafer 12, and the adhesive layer 16 and reaches the part of the glass substrate 14 in the thickness direction of the semiconductor device 10. Afterward, the mechanical stress 28 is applied to the wafer member 22 on both sides of the supporting stage 26. As a result, the cut portion 32 becomes the initiation portion of the crack 34 in the glass substrate 14, and the wafer member 22 is divided into the semiconductor devices 10.

In the method of producing the semiconductor device 10, the glass substrate 14 is not completely cut with the dicing blade 24 in the thickness direction of the semiconductor device 10. Rather, as described above, the cut portion 32 is formed with the dicing blade 24, so that the cut portion 32 reaches the part of the glass substrate 14 in the thickness direction of the semiconductor device 10.

Accordingly, as compared with the conventional method in which the wafer member 22' is diced using the dicing blade 24' to completely cut the glass substrate 14', it is possible to reduce resistance applied to the dicing blade 24 from the glass substrate 14. As a result, even when the dicing blade 24 is subject to resistance from the glass substrate 14 greater than that from the wafer 12, it is not necessary to decrease a rotational speed and a moving speed of the dicing blade 24 according to the glass substrate 14, thereby making it possible to increase the rotational speed and the moving speed of the dicing blade 24 according to the wafer 12.

As a result, as compared with the conventional method in which the wafer member 22' is diced using the dicing blade 24' to completely cut the wafer 12', the adhesive layer 16', and the glass substrate 14', it is possible to reduce a period of time in the dicing step, thereby improving production efficiency of the semiconductor device 10.

In the embodiment, in the individual piece dividing step, the supporting stage 26 is placed under the dicing tape 30, and the mechanical stress 28 is applied to the wafer member 22 on both sides of the supporting stage 26 from the side of the outer connection terminals 20. Alternatively, the wafer member 22 may be supported on both sides of the supporting stage 26 from the side of the outer connection terminals 20, and a mechanical stress is applied to the supporting stage 26.

Further, in the embodiment, in the individual piece dividing step, the mechanical stress 28 is applied to the wafer member 22. Alternatively, a thermal stress may be applied to the wafer member 22, so that the glass substrate 14 is expanded or contracted and broken with the cut portion 32 as an initiation portion.

Second Embodiment

Figure 3:
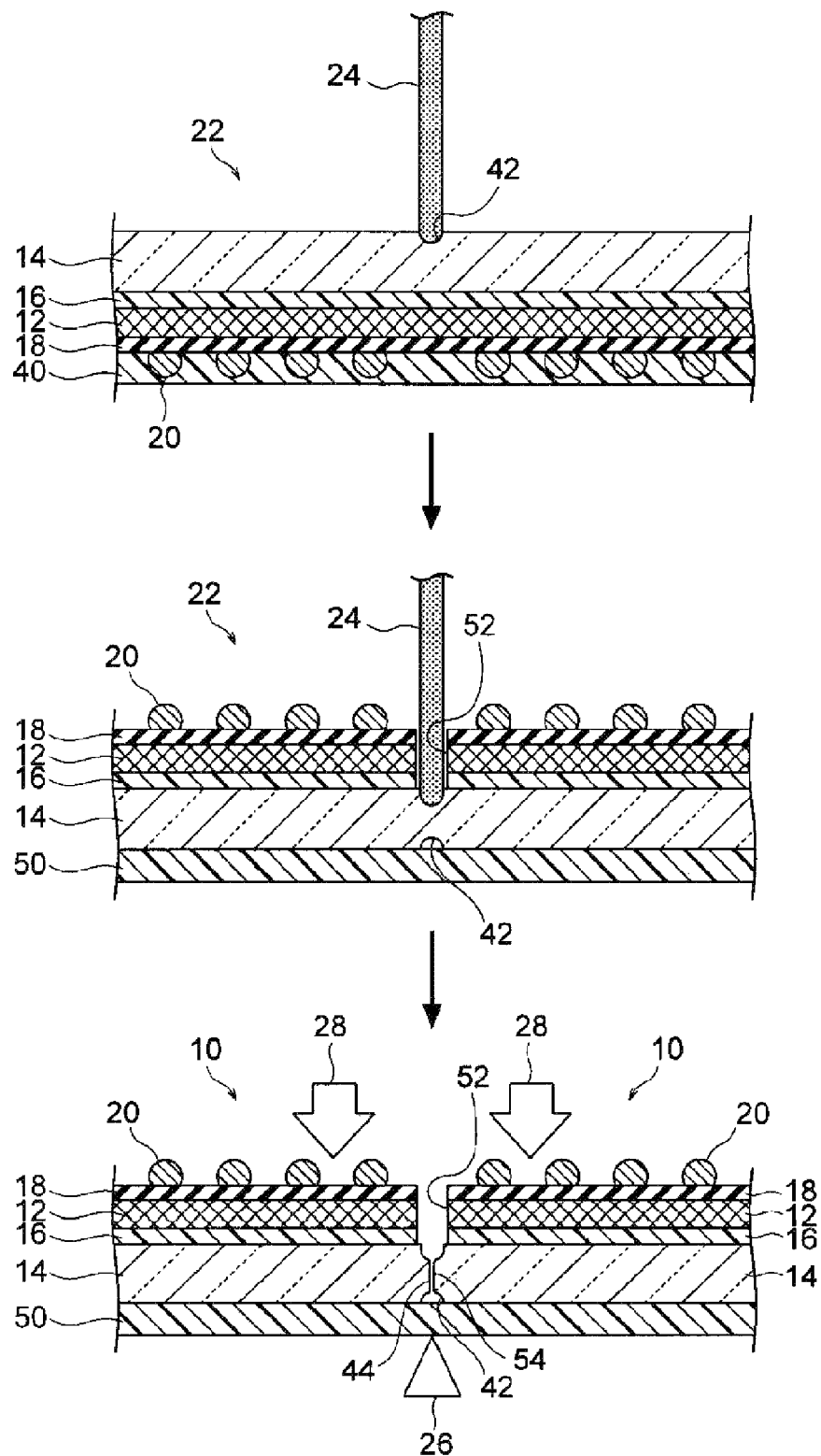
FIG. 3 is a schematic sectional view showing a semiconductor device in a manufacturing process thereof according to a second embodiment of the present invention.

A second embodiment of the present invention will be explained next. FIG. 3 is a schematic sectional view showing a semiconductor device in a manufacturing process thereof according to the second embodiment of the present invention.

As shown in an upper portion of FIG. 3, before the wafer member 22 is divided into a single piece, the wafer member 22 is attached to a dicing tape 40 such that the outer connection terminals 20 face downwardly. In this state, a cut portion 42 is formed in a surface layer of the glass substrate 14 (a part of the glass substrate 14 in the thickness direction) on a side thereof opposite to the adhesive layer 16 with the dicing blade 24, so that the cut portion 42 becomes a fracture initiation portion (a fracture initiation portion forming step).

In the next step, as shown in a middle portion of FIG. 3, the wafer member 22 is attached to a dicing tape 50 such that the glass substrate 14 faces downwardly. In this state, a cut portion 52 is formed with the dicing blade 24, so that the cut portion 52 is overlapped with the cut portion 42 in a plane view. Further, the cut portion 52 penetrates the insulation film 18, the wafer 12, and the adhesive layer 16, and reaches a part of the glass substrate 14 in the thickness direction of the semiconductor device 10 (a dicing step).

In the next step, as shown in a lower portion of FIG. 3, the supporting stage 26 is placed under the dicing tape 50, and the mechanical stress 28 is applied to the wafer member 22 on both sides of the supporting stage 26 from the side of the outer connection terminals 20. As a result, the cut portion 42 becomes an initiation portion of a crack 44 in the glass substrate 14, and the cut portion 52 becomes an initiation portion of a crack 54 in the glass substrate 14. When the crack 44 propagates through the glass substrate 14 and is connected to the crack 54, the wafer member 22 is divided into the semiconductor devices 10 (an individual piece dividing step).

As described above, in the embodiment of the present invention, as shown in FIG. 3, the cut portion 42 is formed in the surface layer of the glass substrate 14 on the side thereof opposite to the adhesive layer 16 with the dicing blade 24. Then, the cut portion 42 is formed with the dicing blade 24, so that the cut portion 52 is overlapped with the cut portion 42 in a plane view. Further, the cut portion 52 penetrates the insulation film 18, the wafer 12, and the adhesive layer 16 and reaches the part of the glass substrate 14 in the thickness direction of the semiconductor device 10. Afterward, the mechanical stress 28 is applied to the wafer member 22. As a result, the cut portion 42 becomes the initiation portion of the crack 34 in the glass substrate 14, and the cut portion 52 becomes the initiation portion of the crack 54 in the glass substrate 14. When the crack 44 propagates through the glass substrate 14 and is connected to the crack 54, the wafer member 22 is divided into the semiconductor devices 10.

In the method of producing the semiconductor device 10, the glass substrate 14 is not completely cut with the dicing blade 24 in the thickness direction of the semiconductor device 10. Rather, as described above, the cut portion 52 is formed with the dicing blade 24, so that the cut portion 52 reaches the part of the glass substrate 14 in the thickness direction of the semiconductor device 10.

Accordingly, as compared with the conventional method in which the wafer member 22' is diced using the dicing blade 24' to completely cut the glass substrate 14', it is possible to reduce resistance applied to the dicing blade 24 from the glass substrate 14. As a result, even when the dicing blade 24 is subject to resistance from the glass substrate 14 greater than that from the wafer 12, it is not necessary to decrease a rotational speed and a moving speed of the dicing blade 24 according to the glass substrate 14, thereby making it possible to increase the rotational speed and the moving speed of the dicing blade 24 according to the wafer 12.

As a result, as compared with the conventional method in which the wafer member 22' is diced using the dicing blade 24' to completely cut the wafer 12', the adhesive layer 16', and the glass substrate 14', it is possible to reduce a period of time in the dicing step, thereby improving production efficiency of the semiconductor device 10.

Note that, in the first embodiment, the glass substrate 14 has an amorphous structure. Accordingly, it may be difficult to control a direction of the crack 34, thereby causing a variance in an outer dimension of the glass substrate 14 on a side opposite to the adhesive layer 16.

On the other hand, in the embodiment, the cut portion 42 and the cut portion 52 are formed in both sides of the glass substrate 14. Accordingly, as compared with the first embodiment in which the cut portion 32 is formed in the glass substrate 14 only on the side of the adhesive layer 16, it is possible to reduce a variance in an outer dimension of the semiconductor device 10 when the wafer member 22 is divided into the semiconductor devices 10.

Note that, in the second embodiment, in the individual piece dividing step, the supporting stage 26 is placed under the dicing tape 50, and the mechanical stress 28 is applied to the wafer member 22 on both sides of the supporting stage 26 from the side of the outer connection terminals 20. Alternatively, the wafer member 22 may be supported on both sides of the supporting stage 26 from the side of the outer connection terminals 20, and a mechanical stress is applied to the supporting stage 26.

Further, in the embodiment, in the individual piece dividing step, the mechanical stress 28 is applied to the wafer member 22. Alternatively, a thermal stress may be applied to the wafer member 22, so that the glass substrate 14 is expanded or contracted and broken with the cut portion 42 and the cut portion 52 as an initiation portion.

Further, in the embodiment, in the fracture initiation portion forming step, the cut portion 42 is formed in the surface layer of the glass substrate 14 on the side thereof opposite to the adhesive layer 16 with the dicing blade 24, so that the cut portion 42 becomes the fracture initiation portion. Alternatively, a scratch may be formed with a diamond needle and the like, or a modified region may be formed with a laser beam.

Third Embodiment

Figure 4:
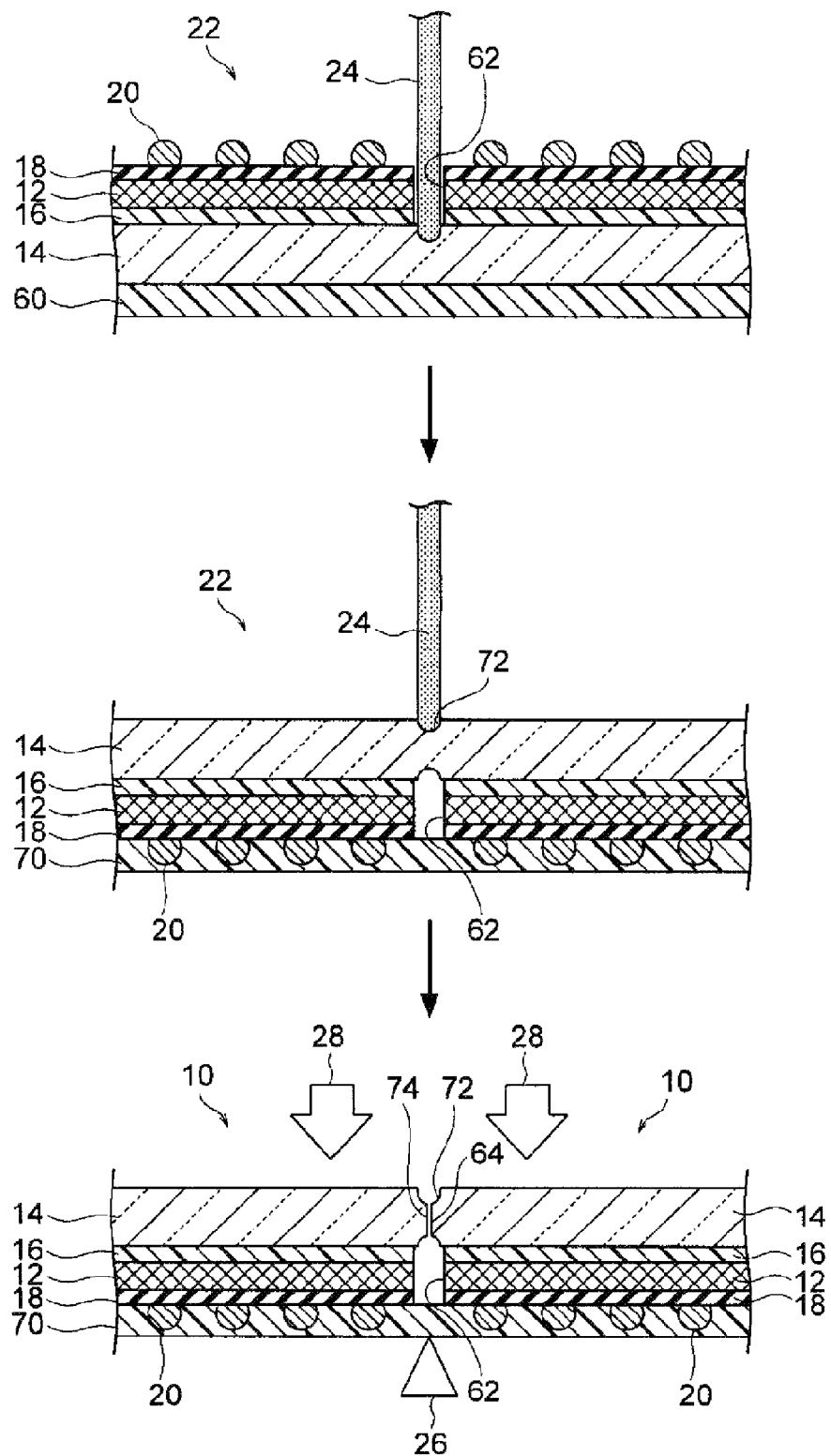
FIG. 4 is a schematic sectional view showing a semiconductor device in a manufacturing process thereof according to a third embodiment of the present invention.

A third embodiment of the present invention will be explained next. FIG. 4 is a schematic sectional view showing a semiconductor device in a manufacturing process thereof according to the third embodiment of the present invention.

As shown in an upper portion of FIG. 4, before the wafer member 22 is divided into a single piece, the wafer member 22 is attached to a dicing tape 60 such that the glass substrate 14 faces downwardly. In this state, a cut portion 62 is formed with the dicing blade 24, so that the cut portion 62 penetrates through the insulation film 18, the wafer 12, and the adhesive layer 16, and reaches a part of the glass substrate 14 in the thickness direction (a dicing step).

In the next step, as shown in a middle portion of FIG. 4, the wafer member 22 is attached to a dicing tape 70 such that the wafer member 22 faces downwardly. In this state, a cut portion 72 is formed with the dicing blade 24, so that the cut portion 72 is overlapped with the cut portion 62 in a plane view of the wafer member 22, and is formed in a surface layer of the glass substrate 14 (a part of the glass substrate 14 in the thickness direction of the semiconductor device 10) on a side corresponding to the cut portion 62 opposite to the adhesive layer 16. Accordingly, the cut portion 72 becomes a fracture initiation portion (a fracture initiation portion forming step).

In the next step, as shown in a lower portion of FIG. 4, the supporting stage 26 is placed under the dicing tape 70, and the mechanical stress 28 is applied to the wafer member 22 on both sides of the supporting stage 26 from the side of the outer connection terminals 20. As a result, the cut portion 62 becomes an initiation portion of a crack 64 in the glass substrate 14, and the cut portion 72 becomes an initiation portion of a crack 74 in the glass substrate 14. When the crack 64 propagates through the glass substrate 14 and is connected to the crack 74, the wafer member 22 is divided into the semiconductor devices 10 (an individual piece dividing step).

As described above, in the embodiment of the present invention, as shown in FIG. 4, the cut portion 62 is formed with the dicing blade 24, so that the cut portion 62 penetrates through the insulation film 18, the wafer 12, and the adhesive layer 16, and reaches a part of the glass substrate 14 in the thickness direction. Then, the cut portion 72 is formed with the dicing blade 24, so that the cut portion 72 is overlapped with the cut portion 62 in the plane view of the wafer member 22, and is formed in the surface layer of the glass substrate 14 on the side corresponding to the cut portion 62 opposite to the adhesive layer 16. Afterward, the mechanical stress 28 is applied to the wafer member 22. As a result, the cut portion 62 becomes the initiation portion of the crack 64 in the glass substrate 14, and the cut portion 72 becomes the initiation portion of the crack 74 in the glass substrate 14. When the crack 64 propagates through the glass substrate 14 and is connected to the crack 74, the wafer member 22 is divided into the semiconductor devices 10.

In the method of producing the semiconductor device 10, the glass substrate 14 is not completely cut with the dicing blade 24 in the thickness direction of the semiconductor device 10. Rather, as described above, the cut portion 62 is formed with the dicing blade 24, so that the cut portion 62 reaches the part of the glass substrate 14 in the thickness direction of the semiconductor device 10.

Accordingly, as compared with the conventional method in which the wafer member 22' is diced using the dicing blade 24' to completely cut the glass substrate 14', it is possible to reduce resistance applied to the dicing blade 24 from the glass substrate 14. As a result, even when the dicing blade 24 is subject to resistance from the glass substrate 14 greater than that from the wafer 12, it is not necessary to decrease a rotational speed and a moving speed of the dicing blade 24 according to the glass substrate 14, thereby making it possible to increase the rotational speed and the moving speed of the dicing blade 24 according to the wafer 12.

As a result, as compared with the conventional method in which the wafer member 22' is diced using the dicing blade 24' to completely cut the wafer 12', the adhesive layer 16', and the glass substrate 14', it is possible to reduce a period of time in the dicing step, thereby improving production efficiency of the semiconductor device 10.

As described above, in the third embodiment, the cut portion 62 and the cut portion 72 are formed in both sides of the glass substrate 14. Accordingly, as compared with the first embodiment in which the cut portion 32 is formed in the glass substrate 14 only on the side of the adhesive layer 16, it is possible to reduce a variance in an outer dimension of the semiconductor device 10 when the wafer member 22 is divided into the semiconductor devices 10.

Note that, in the third embodiment, in the individual piece dividing step, the supporting stage 26 is placed under the dicing tape 70, and the mechanical stress 28 is applied to the wafer member 22 on both sides of the supporting stage 26 from the side of the outer connection terminals 20. Alternatively, the wafer member 22 may be supported on both sides of the supporting stage 26 from the side of the outer connection terminals 20, and a mechanical stress is applied to the supporting stage 26.

Further, in the embodiment, in the individual piece dividing step, the mechanical stress 28 is applied to the wafer member 22. Alternatively, a thermal stress may be applied to the wafer member 22, so that the glass substrate 14 is expanded or contracted and broken with the cut portion 62 and the cut portion 72 as an initiation portion.

Further, in the embodiment, in the fracture initiation portion forming step, the cut portion 72 is formed in the surface layer of the glass substrate 14 on the side thereof opposite to the adhesive layer 16 with the dicing blade 24, so that the cut portion 72 becomes the fracture initiation portion. Alternatively, a scratch may be formed with a diamond needle and the like, or a modified region may be formed with a laser beam.

The disclosure of Japanese Patent Application No. 2009-077566, filed on Mar. 26, 2009, is incorporated in the application by reference.

While the invention has been explained with reference to the specific embodiments of the invention, the explanation is illustrative and the invention is limited only by the appended claims.

What is claimed is:

1. A method of producing a semiconductor device comprising:
   a dicing step of dicing a wafer member using a dicing blade to form a cut portion in the wafer member, said wafer member being formed of a wafer portion, a glass substrate, and an adhesive layer for bonding the wafer portion and the glass substrate in a thickness direction of the wafer member so that the cut portion penetrates the wafer portion and the adhesive layer and reaches a part of the glass substrate; and
   an individual piece dividing step of applying a mechanical force to the wafer member so that the wafer member is divided into a plurality of semiconductor devices with the cut portion as a fracture initiation portion,
   wherein, in the individual piece dividing step, a bending force is applied to the wafer member as the mechanical force so that the cut portion substantially matches to a bending center point of the bending force.

2. The method of producing the semiconductor device according to claim 1, further comprising the step of attaching the wafer member to a dicing tape so that the mechanical force is applied to the wafer member through the dicing tape.

3. A method of producing a semiconductor device comprising:
   a fracture initiation portion forming step of forming a fracture initiation portion in a surface layer of a glass substrate of a wafer member, said wafer member being formed of a wafer portion, the glass substrate, and an adhesive layer for bonding the wafer portion and the glass substrate in a thickness direction of the wafer member so that the surface layer of the glass substrate is situated on a side opposite to the adhesive layer;
   a dicing step of dicing the wafer member along the fracture initiation portion using a dicing blade to form a cut portion in the wafer member so that the cut portion penetrates the wafer portion and the adhesive layer, and an uncut portion of the glass substrate remains between the cut portion and the fracture initiation portion; and
   an individual piece dividing step of dividing the wafer member into a plurality of semiconductor devices along the fracture initiation portion and the cut portion.

4. The method of producing the semiconductor device according to claim 3, wherein, in the individual piece dividing step, a mechanical force is applied to the wafer member so that the wafer member is vided into the semiconductor devices along the fracture initiation portion and the cut portion.

5. The method of producing the semiconductor device according to claim 4, further comprising the steps of:
   attaching the wafer member to a first dicing tape before the dicing step;
   removing the first dicing tape after the dicing step; and
   attaching the wafer member to a second dicing tape so that the mechanical force is applied to the wafer member through the second dicing tape.

6. The method of producing the semiconductor device according to claim 3, wherein, in the individual piece dividing step, a bending force is applied to the wafer member so that the cut portion substantially matches to a bending center point of the bending force.

7. A method of producing a semiconductor device comprising:
   a dicing step of dicing a wafer member using a dicing blade to form a cut portion in the wafer member, said wafer member being formed of a wafer portion, a glass substrate, and an adhesive layer for bonding the wafer portion and the glass substrate in a thickness direction of the wafer member so that the cut portion penetrates the wafer portion and the adhesive layer and reaches a part of the glass substrate;
   a fracture initiation portion forming step of forming a fracture initiation portion in a surface layer of the glass substrate on a side opposite to the adhesive layer so that the fracture initiation portion is overlapped with the cut portion in a plan view of the wafer member, and an uncut portion of the glass substrate remains between the cut portion and the fracture initiation portion; and
   an individual piece dividing step of dividing the wafer member into a plurality of semiconductor devices along the cut portion and the fracture initiation portion.

8. The method of producing the semiconductor device according to claim 7, wherein, in the individual piece dividing step, a mechanical force is applied to the wafer member so that the wafer member is vided into the semiconductor devices along the cut portion and the fracture initiation portion.

9. The method of producing the semiconductor device according to claim 8, further comprising the steps of:
   attaching the wafer member to a first dicing tape before the dicing step;
   removing the first dicing tape after the dicing step; and
   attaching the wafer member to a second dicing tape so that the mechanical force is applied to the wafer member through the second dicing tape.

10. The method of producing the semiconductor device according to claim 7, wherein, in the individual piece dividing step, a bending force is applied to the wafer member so that the cut portion substantially matches to a bending center point of the bending force.

* * * * *